(12) United States Patent
Voortman et al.

(10) Patent No.: US 12,387,905 B2
(45) Date of Patent: Aug. 12, 2025

(54) APPARATUS AND METHOD FOR DETECTING ONE OR MORE SCANNING CHARGED PARTICLE BEAMS

(71) Applicant: DELMIC IP B.V., Delft (NL)

(72) Inventors: Lenard Maarten Voortman, Delft (NL); Andries Pieter Johan Effting, Delft (NL)

(73) Assignee: DELMIC IP B.V., Delft (NL)

( * ) Notice: Subject to any disclaimer, the term of this patent is extended or adjusted under 35 U.S.C. 154(b) by 519 days.

(21) Appl. No.: 17/615,414

(22) PCT Filed: Jun. 3, 2020

(86) PCT No.: PCT/NL2020/050358
§ 371 (c)(1),
(2) Date: Nov. 30, 2021

(87) PCT Pub. No.: WO2020/246881
PCT Pub. Date: Dec. 10, 2020

(65) Prior Publication Data
US 2022/0238297 A1    Jul. 28, 2022

(30) Foreign Application Priority Data

Jun. 3, 2019 (NL) ..................................... 2023249

(51) Int. Cl.
*H01J 37/28* (2006.01)
*H01J 37/147* (2006.01)
(Continued)

(52) U.S. Cl.
CPC ........ *H01J 37/226* (2013.01); *H01J 37/1474* (2013.01); *H01J 37/20* (2013.01);
(Continued)

(58) Field of Classification Search
None
See application file for complete search history.

(56) References Cited

U.S. PATENT DOCUMENTS 9,378,921 B2   6/2016  Hoogenboom et al.
10,453,649 B2  10/2019 Kruit et al.
(Continued)

FOREIGN PATENT DOCUMENTS

JP   S60055250 A   3/1985
JP   S60122332 A   6/1985
(Continued)

OTHER PUBLICATIONS

International Search Report and Written Opinion from PCT Application No. PCT/NL2020/050358, Oct. 15, 2020.
(Continued)

*Primary Examiner* — Eliza W Osenbaugh-Stewart
(74) *Attorney, Agent, or Firm* — Workman Nydegger (57) ABSTRACT

A method and an apparatus are provided for inspecting a sample. The apparatus includes a sample holder for holding the sample, a charged particle column for generating and focusing one or more charged particle beams at one or more charged particle beam spots onto the sample, a scanning deflector for moving the charged particle beam spot(s) over the sample, a photon detector configured for detecting photons created when the one or more charged particle beams impinge on the sample or when the one or more charged particle beams impinge onto a layer of luminescent material after transmission through the sample, an optical assembly for projecting or imaging at least part of the photons from the charged particle beam spot(s) along an optical beam path onto the photon detector, and a shifting unit for shifting the optical beam path and/or the photon detector with respect to each other.

17 Claims, 8 Drawing Sheets

(51) Int. Cl.
    *H01J 37/20*     (2006.01)
    *H01J 37/22*     (2006.01)
    *H01J 37/244*    (2006.01)
    *H01J 37/26*     (2006.01)

(52) U.S. Cl.
    CPC .......... *H01J 37/224* (2013.01); *H01J 37/244* (2013.01); *H01J 37/265* (2013.01); *H01J 37/28* (2013.01); *H01J 2237/2445* (2013.01); *H01J 2237/2808* (2013.01)

(56) References Cited

U.S. PATENT DOCUMENTS

| | | | |
|---|---|---|---|
| 2015/0083911 A1* | 3/2015 | Zeidler | H01J 37/28 250/362 |
| 2016/0025659 A1 | 1/2016 | Ominami et al. | |
| 2017/0133198 A1* | 5/2017 | Kruit | H01J 37/244 |

FOREIGN PATENT DOCUMENTS

| | | |
|---|---|---|
| JP | H04306548 A | 10/1992 |
| JP | 2017515283 A | 6/2017 |

OTHER PUBLICATIONS

Zonnevylle et al., "Integration of a High-NA Light Microscope in a Scanning Electron Microscope." Journal of Microscopy, vol. 252, Issue No. 1, Jun. 25, 2013, pp. 58-70.
Ren et al., "Transmission Electron Imaging in the Delft Multibeam Scanning Electron Microscope 1," Journal of Vacuum Science & Technology B: Nanotechnology and Microelectronics, vol. 34, Issue No. 6, Oct. 27, 2016, 12 pages.
Search Report and Written Opinion from corresponding NL Application No. 2023249, Feb. 10, 2020.
Informal Comments to the Written Opinion of PCT Application No. PCT/NL2020/050358, Nov. 10, 2021.
Japanese Office Action from corresponding JP Application No. 2021-572341, Mar. 26, 2024.

* cited by examiner

APPARATUS AND METHOD FOR DETECTING ONE OR MORE SCANNING CHARGED PARTICLE BEAMS

BACKGROUND

The invention relates to an apparatus and method for inspecting a sample by means of one or more scanning charged particle beams, such as a scanning electron microscope or a multi-beam scanning electron microscope.

Such an apparatus or method is for example disclosed in US 2017/0133198 A1. This patent application describes an apparatus comprising a charged particle column for focusing and scanning one or more charged particle beams onto a sample, and a photon detector, in particular a multi-pixel photon detector, arranged for detecting photons created by said one or more focused charged particle beams when said one or more charged particle beams impinge on the sample or after transmission of said one or more charged particle beams through the sample. The apparatus further comprises an optical assembly for conveying photons created by said one or more focused charged particle beams to a photon detector, preferably a multi-pixel photon detector.

As described in US 2017/0133198 A1 the optical assembly can be either arranged at the side of the sample holder which faces towards the electromagnetic lens system of the charged particle column, or at an opposite side of the sample holder which faces away from the charged particle column.

A phenomenon which causes the emission of photons due to the impact of charged particles on a material, in particular a luminescent material, is referred to as cathodoluminescence. It is noted that in case the sample comprises one or more cathodoluminescent constituents, photons are created by said focused charged particle beams when said primary charged particle beams impinge on the sample, in particular the cathodoluminescent constituents thereof. In addition or alternatively, a layer of cathodoluminescent or scintillator material can be used for the generation of photons by impinging charged particles, such as electrons, protons or ions.

US 2017/0133198 describes an apparatus which comprises a layer of cathodoluminescent or scintillator material, wherein the apparatus is configured to position the sample between the electro-magnetic lens system and the layer of cathodoluminescent or scintillator material, such that the charged particles impinge on the layer of cathodoluminescent or scintillator material after transmission through said sample. The apparatus further comprises an optical assembly which is arranged to project or image the position where the photons are created onto the photon detector.

SUMMARY OF THE INVENTION

When using one or more charged particle beams which are scanned over a certain part of the surface of a sample, the position where the photons are created in the sample or in the layer of cathodoluminescent or scintillator material moves during the scanning. Accordingly, when projecting or imaging the sample or layer of cathodoluminescent or scintillator material onto the photon detector, the light spots originating from the impact positions of the charged particles also move over the photon detector.

On the one hand, the movement of the light spot(s) over the detector poses no problem when during the movement of said light spot, the light spot remains within an area of the detector. However, detectors with relatively large detector areas usually have a relatively slow response, which results is a relatively slow acquisition of an image. In addition, in a multi-beam system, the scanning path of two adjacent beams are arranged very close to each other or may even overlap over a certain distance, which makes it very difficult or even impossible to arrange adjacent detectors to detect only one specific light spot of the adjacent light spots.

On the other hand, the light spot(s) can be detected by means of a multi-pixel detector, where during the movement of the light spot(s) said light spot(s) are projected on and measured by different pixels of said multi-pixel detector. However, tracking and measuring the intensity of the light spots by a multi-pixel detector is a relatively slow process which considerably hampers a quick acquisition of image.

It is an object of the present invention to provide an apparatus and method which at least partially solves one or more of the above disadvantages.

According to a first aspect, the invention provides an apparatus for inspecting a sample, wherein the apparatus comprises:

- a sample holder for holding the sample,
- a charged particle column for generating and directing one or more charged particle beams towards the sample holder, wherein said charged particle column is configured for focusing said one or more charged particle beams at one or more charged particle beam spots onto the sample,
- a scanning unit for scanning the one or more charged particle beam spots over the sample in a scanning direction,
- a photon detector for detecting photons created by said one or more focused charged particle beams when said one or more charged particle beams impinge on the sample or when said one or more charged particle beams impinge onto a layer of luminescent material after transmission of said one or more charged particle beams through the sample,
- an optical assembly for projecting or imaging at least part of said photons from said one or more charged particle beam spots along an optical beam path onto one or more light spots on said photon detector, and
- a shifting unit for shifting the one or more light spots and/or the photon detector with respect to each other, wherein said shifting unit is configured for at least partially compensating a movement of the one or more charged particle beams on the sample or on the layer of luminescent material due to the scanning of the one or more charged particle beam spots by the scanning unit.

The apparatus of the present invention is provided with a shifting unit which is configured for shifting the optical beam path with respect to the photon detector and/or for shifting the photon detector with respect to the optical beam path. The shifting unit is configured for at least partially compensating the movement of the positions on the sample or on the layer of luminescent or scintillator material where photons are created due to the scanning of the one or more charged particle beams. Accordingly, the shifting unit is configured to shift the optical path for the photons and/or the position of the detector with respect to each other, in particular such that one or more positions on the detector where the photons are projected to or imaged on shifts to a lesser extend or even shifts not at all over the detector during the scanning of the one or more charged particle beam spots by the scanning deflector.

Accordingly, detectors with relatively small detector areas can be used, which can have a raster response time then detectors with relatively large detector areas. In addition, overlapping of the scanning path of two adjacent beams at the detector can substantially be prevented, even of the scanning path of the charges particle beams on the sample are partially overlapping.

Furthermore, when a multi-pixel detector is used for measuring the light spot(s), the shifting unit can at least partially compensate or even nullifies the movement of the light spot(s) on the detector, even when the charges particle beams are scanned over the sample. Accordingly, due to the shifting unit, the tracking of the light spots can be circumvented at least to a large extend.

Accordingly, the apparatus of the invention allows a much quicker acquisition of images when compared to prior art devices.

In addition, due to the compensation by the shifting unit, the one or more charged particle beam can be moved over a larger distance over the sample, which allows to record a larger scan field or several adjacent scan field before the sample holder has to move for bringing another part of the sample to the scan field. Accordingly, less sample movement is required and/or stage settling time after moving the sample holder can be reduced.

Although, in an embodiment, the detector may be physically moved along with the movement of the light spots.

Preferably, in an embodiment, the shifting unit is configured to provide a component of the optical assembly with the ability for shifting the trajectories of the light beams between the sample and the detector. By configuring the optical assembly such that it comprises the shifting unit configured for moving said one or more photon beam spots over said photon detector, a movement of the one or more charged particle beam spots over the sample can be at least partially compensated, and the movement of the one or more photon beam spots on the photon detector can at least be reduced, and preferably be eliminated.

In an embodiment, the optical assembly comprises an objective lens for collecting at least part of said photons from said one or more charged particle beam spots, wherein the shifting unit comprises an objective lens actuator for moving the objective lens with respect to the sample holder, and wherein the objective lens actuator is configured to move the objective lens in a direction substantially parallel to the scanning direction. In an embodiment, the objective lens comprises an optical axis, wherein the objective lens actuator is configured to move the objective lens in a direction substantially perpendicular to the optical axis of the objective lens. When moving the objective lens with respect to the sample holder, the image projected by the lens and the other parts of the optical assembly will move over the detector. In this embodiment, the movement of the image due to the moving of the objective lens is used for at least partially compensating the scanning of the charged particle beam over the sample.

In an embodiment, the optical assembly comprises a projection lens for projecting said at least part of said photons onto the photon detector, wherein the shifting unit comprises a projection lens actuator for moving the projection lens with respect to the photon detector. In an embodiment, the projection lens comprises an optical axis, wherein the projection lens actuator is configured to move the projection lens in a direction substantially perpendicular to the optical axis of the projection lens. Just as the objective lens, also when the optical assembly comprises a projection lens, the image projected by the optical assembly will move over the detector when the projection lens is moved. In this embodiment, the movement of the image due to the moving of the projection lens is used for at least partially compensating the scanning of the charged particle beam over the sample.

In an embodiment, the optical assembly comprises a mirror arranged in the optical beam path between the sample holder and the photon detector, wherein the mirror is configured for reflecting the optical beam path at a deflection angle between 0 and 180 degrees, wherein the shifting unit comprises a mirror actuator which is configured for tilting the mirror. In an embodiment, the mirror actuator is configured for tilting the mirror around a rotation axis, wherein the rotation axis is arranged substantially perpendicular to the scanning direction. The mirror is arranged in the optical beam path of the optical assembly in order to deflect the optical beam path over the deflection angle. Accordingly, the optical beam path is bend on its way from the sample holder to the photon detector over the deflection angle. By tilting the mirror over a tilting angle around the deflection angle, the optical beam path is scanned over the detector. In this embodiment, the tilting of the mirror is used for at least partially compensating the scanning of the charged particle beam over the sample.

The tilting of the mirror may be a small tilting angle around the deflection angle, which tilting angle needs to be only large enough for compensating the scanning of the charged particle beam. In an embodiment, the tilting mirror is arranged to tilt over the tilting angle in a direction clock-wise and anti clock-wise around its rotation axis, preferably in a reciprocating motion around the deflection angle. Alternatively, a rotating mirror can be used which rotates in the same direction around its rotation axis; either clock-wise or anti clock-wise.

In an embodiment, the optical assembly comprises a polygon mirror arranged in the optical beam path between the sample holder and the photon detector, wherein the mirror is configured for reflecting the optical beam path at a deflection angle between 0 and 180 degrees, wherein the shifting unit comprises a rotating actuator which is configured for rotating the polygon mirror. In an embodiment, the polygon mirror is configured for rotating the mirror around a rotation axis, wherein the rotation axis is arranged substantially perpendicular to the scanning direction. A polygon mirror comprises a cylindrical body with a cross-section in the shape of a regular polygon. Each side area of the cylindrical body with the polygon cross-section comprises a substantially flat mirror facet. In an embodiment the cross-section is in the shape of a square, pentagon, hexagon, octagon, etc. . . . By rotating the polygon mirror around its center axis the adjacent flat mirror facets are subsequently moved into the optical beam path, and the rotation flat mirror facets provide the shifting of the optical beam path and the optical beam path is scanned over the detector. In this embodiment, the rotation of the polygon mirror is used for at least partially compensating the scanning of the charged particle beam over the sample.

In an embodiment, the optical assembly comprises an optical window arranged in the optical beam path between the sample holder and the photon detector, wherein the optical window is arranged so that the optical beam path traverses said optical window, wherein the shifting unit comprises a tilting actuator which is configured for tilting the optical window. In an embodiment, the tilting actuator is configured for tilting the optical window around a rotation axis, wherein the rotation axis is arranged substantially perpendicular to the scanning direction. Preferably the optical window comprises a transparent front and rear surface, wherein the rear surface is parallel with the front surface.

When the optical window is arranged in the optical beam path such that the optical axis of the optical beam path is arranged perpendicular to the front and rear surface, the optical beam path traverses straight through the optical window. However, when the optical window is tilted such that the front or rear surface and the optical axis of the optical beam path include an angle between 0 and 90 degrees, the optical beam path is shifted parallel to the original optical beam path, wherein the distance between the shifted optical beam path and the original optical beam path de-ends on the angle between the front surface and the optical axis of the optical beam path, and on the thickness of the optical window. By tilting the optical window around the rotation axis over a tilting angle, the optical beam path shifts in a direction perpendicular to the rotation axis over a distance and the optical beam path is scanned over the detector. In this embodiment, the tilting of the optical window is used for at least partially compensating the scanning of the charged particle beam over the sample.

The tilting of the optical window may be a small tilting angle around a preset angle between the front surface of the optical window and the optical axis of the optical beam path, which tilting angle needs to be only large enough for compensating the scanning of the charged particle beam. In an embodiment, the optical window is arranged to tilt over the tilting angle in a direction clock-wise and anti clock-wise around its rotation axis, preferably in a reciprocating motion around the preset angle. Alternatively, an optical window can be used which rotates in the same direction around its rotation axis; either clock-wise or anti clock-wise.

In an embodiment, the optical assembly comprises an optical transparent polygon arranged in the optical beam path between the sample holder and the photon detector, wherein the optical transparent polygon is arranged so that the optical beam path traverses said optical transparent polygon wherein the shifting unit comprises a rotating actuator which is configured for rotating the optical transparent polygon. In an embodiment, the rotating actuator is configured for rotating the optical transparent polygon around a rotation axis, wherein the rotation axis is arranged substantially perpendicular to the scanning direction. The optical transparent polygon comprises a cylindrical body with a cross-section in the shape of a regular polygon with an even number of side facets. Each side facet of the cylindrical body with the polygon cross-section provides an optical transparent surface. In an embodiment the cross-section is in the shape of a square, hexagon, octagon, etc. . . . Two optical transparent surfaces at opposite sides with respect to the optical axis, act as an optical window as described above. The optical beam traverses the optical transparent polygon, just as the optical window. By rotating the optical transparent polygon around its center axis the adjacent transparent facets are subsequently moved into the optical beam path, and angle between the transparent face and the optical axis of the optical beam path is changed, which provides the shifting of the optical beam path and the optical beam path is scanned over the detector. In this embodiment, the rotation of the optical transparent polygon is used for at least partially compensating the scanning of the charged particle beam over the sample.

In an embodiment, the apparatus further comprises a first control unit for controlling the scanning unit, and a second control unit for controlling the shifting unit, wherein the first control unit is configured for sending a scanning information signal to the second control unit, and wherein the second control unit is configured controlling the shifting unit based on the scanning information signal. By providing a scanning information signal from the first control unit to the second control unit can control the shifting unit to accurately compensate the scanning of the charged particle beams. In an embodiment the first and second control unit are combined in one single control unit.

In an embodiment, the shifting unit is a first shifting unit, wherein the apparatus further comprises a second shifting unit, wherein the second shifting unit is configured for shifting the one or more light spots and/or the photon detector with respect to each other in a shifting direction substantially perpendicular to the shifting direction of the first shifting unit. The combined first and second shifting unit allows to compensate the scanning of the one or more charged particle beams in orthogonal directions, which is commonly used for scanning an area on the sample.

In an embodiment, the charged particle column is configured for generating multiple charged particle beams, and for directing and focusing of said multiple charged particle beams in an array of spaced apart spots at the sample holder. In an embodiment, the detector comprises a multi-pixel photon detector, preferably wherein the multi-pixel photon detector is configured for having one or more distinct pixels for detecting photons from each spot of said spaced apart spots at the sample. In an embodiment, the apparatus is configured for projecting photons originating from each one of the multiple charged particle beams on a corresponding pixel of the multi-pixel photon detector. In an embodiment, the multi-pixel photon detector comprises one pixel for each charged particle beam of said multiple charged particle beams. In an embodiment, the detector comprises a multi-pixel photon counting detector.

According to a second aspect, the present invention provides a method for inspecting a sample, wherein the method comprises the steps of:

arranging the sample in a sample holder, generating and directing one or more charged particle beams towards the sample using a charged particle column, wherein said charged particle column focuses said one or more charged particle beams at one or more charged particle beam spots onto the sample, wherein photons are created by said one or more focused charged particle beams when said one or more charged particle beams impinge on the sample or when said one or more charged particle beams impinge onto a layer of luminescent material after transmission of said one or more charged particle beams through the sample, projecting or imaging at least part of said photons from said one or more charged particle beam spots along an optical beam path onto one or more light spots on a photon detector using an optical assembly, detecting photons suing the photon detector, and scanning the one or more charged particle beam spots over the sample in a scanning direction using a scanning unit, and shifting the one or more light spots and/or the photon detector with respect to each other using a shifting unit, wherein said shifting unit at least partially compensates a movement of the one or more charged particle beams on the sample or on the layer of luminescent material due to the scanning of the one or more charged particle beam spots by the scanning unit.

Accordingly, the present method of operating an inspection apparatus, preferably an inspection apparatus as described in one or more of the embodiments above, is such that the displacement of the positions where the photons are created by the charged particle beams in the luminescent material results only in a limited displacement of the photons on the detector, such that cross-talk is restricted to within defined limits.

In an embodiment, the shifting unit compensates the movement of the one or more charged particle beams so that the one or more light spots substantially remain of the same position on the photon detector during the scanning to the one or more charged particle beams by the scanning unit. Accordingly, the displacement of the position where photons are created by the scanning one or more charged particle beams does not result in a displacement of the photons projected on the photon detector.

In an embodiment, the one or more charged particle beams are scanned over a first substantially rectangular area on the sample, subsequently the one or more charged particle beams and the sample are moved with respect to each other over a distance substantially equal to the width of the substantially rectangular area, and then the one or more charged particle beams scan are scanned over a second substantially rectangular area on the sample.

According to a third aspect, the present invention provides a computer-readable medium having computer-executable instructions adapted to cause an apparatus according to the first aspect of the invention as described above to perform a method according to the second aspect of the invention as described above.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
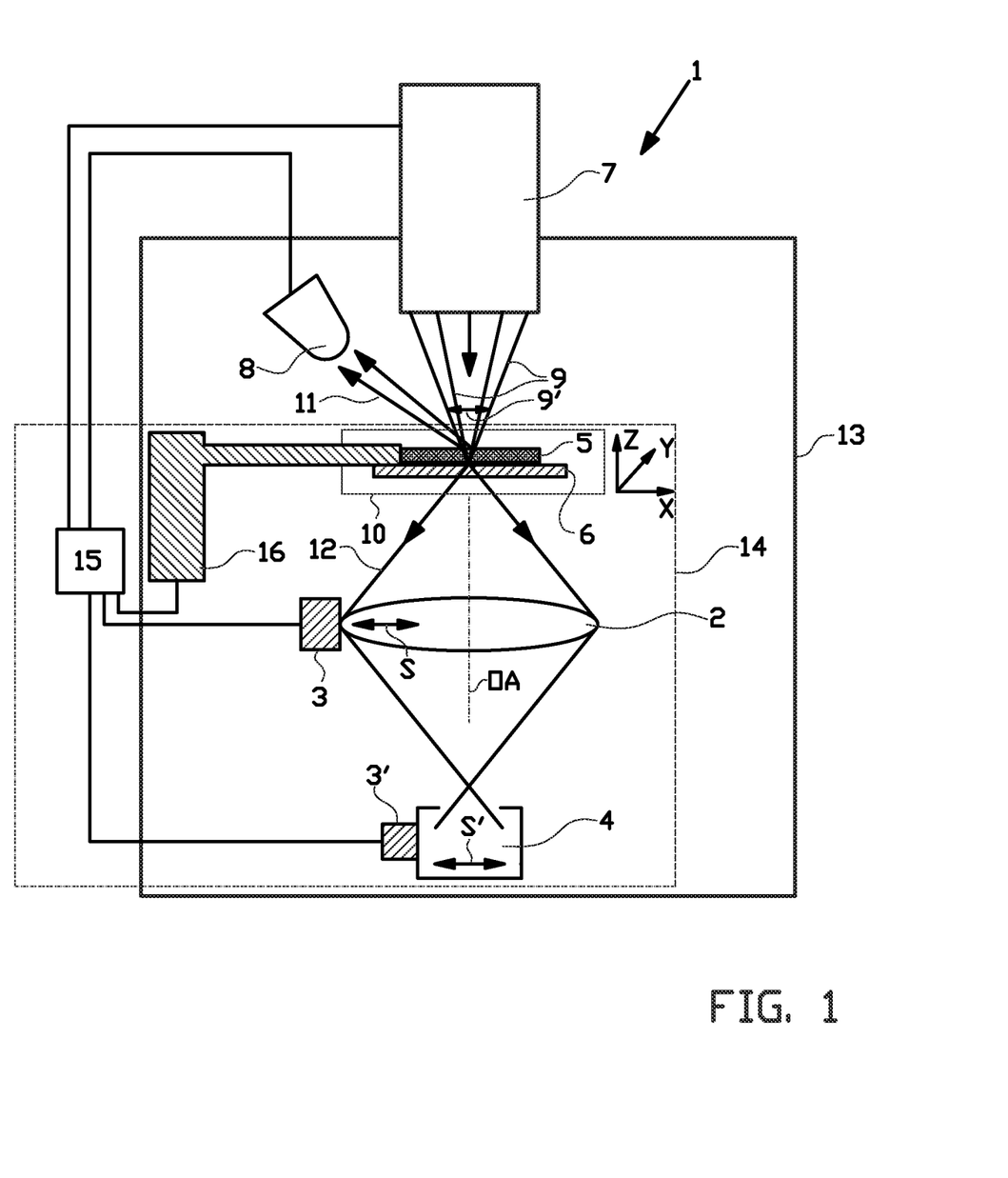
FIG. 1 schematically shows a first exemplary embodiment of an apparatus as typically improved by the present invention.

FIG. 1 schematically shows a first exemplary embodiment of an apparatus as typically improved by the present invention. The apparatus comprises in combination at least a charged particle microscope 7,8, such as an ion- or electron microscope, an optical assembly, and a detector 3.

The charged particle microscope 7, 8 comprises a source 7 for emitting one or more primary charged particle beams 9 and directing said one or more primary charged particle beams to a sample 5 supported by a substrate included in a sample holder 10. The apparatus comprises a detector 8 for detection of secondary charged particles 11 backscattered from the sample 10, or emitted, transmitted, or scattered from the sample 10 and produced by the one or more primary charged particle beams 9. The charged particle microscope 7,8 is substantially arranged inside a vacuum chamber 13.

As schematically indicated in FIG. 1, the charged particle microscope is configured for scanning 9' the one or more primary charged particle beams 9 over the sample 5. Electrostatic and/or magnetic deflectors can be used for scanning 9' the one or more charged particle beams over the sample 5. Such electrostatic and magnetic deflectors are known in the prior art and are not described in detail in this application.

The optical assembly comprises a light collecting device 2, usually referred to as an objective lens, to receive in use light 12 from the sample or from a sheet of scintillator material 6, which light 12 is produced by the one or more primary charged particle beams 9 in the sample or after transmission of the one or more primary charged particle beams 9 through the sample 5. The optical assembly is configured to focus the light 12 on a photon detector 4, such as a known per se CCD camera. In the present example the optical assembly and the detector is placed inside the vacuum chamber 13 of the charged particle microscope 7, 8.

The inspection apparatus 1 comprises a sample holder 10 for holding the sample 5. The sample holder 10 comprises a stage 16 which is configured for positioning and moving the sample 5.

In addition, the sample holder 10 may comprise a sheet of a scintillator material 6, for example comprising a layer of Yttrium Aluminum Garnet (YAG, $Y_3AL_5O_{12}$). The sample holder 10 is configured to position the sample 5 in between the source 7 of the charged particle microscope 7,8 and the sheet of the scintillator material 6. The optical assembly microscope 2, 3, 4 is arranged at a side of the sheet of scintillator material 6 facing away from the sample 5.

The closed dashed line 14 encircles those parts of the inspection apparatus 1 of the invention that may all or some of them be mounted on a (replaceable) door of the vacuum chamber 13. In particular, the sample holder for the sample 10, the light collecting device 2, and the photon-detector 4, are preferably mounted on said door of the vacuum chamber 13. This particular construction enables an easy retrofit or completion of an existing charged particle microscope in order to convert it into an inspection apparatus according of the integrated type as is subject to the present invention.

In FIG. 1, a processing unit 15, alternatively denoted controller, is provided and useable as an automation unit, e.g. in the form of a computer, including a personal computer provided with dedicated software, implementing one or more methods of use of the inspection apparatus.

As schematically indicated in FIG. 1, the sample holder comprises a stage 16 for moving the sample 5 with respect to the optical assembly and/or a charged particle microscope 7,8. Preferably the stage is configured for providing six degrees of freedom for moving the sample 5; thus providing translational movement along the X, Y and Z axis and rotational movement around the X, Y and Z axis.

Furthermore, the inspection apparatus comprises an objective lens actuator 3 for moving the objective lens 2 and/or a detector actuator 3' for moving the detector. The objective lens actuator 3 and/or the detector actuator provide a shifting unit for shifting the optical path of the light 12 and/or the photon detector 4 with respect to each other. In particular, the first shifting unit 3 and/or second shifting unit 3' is configured for at least partially compensating a movement of the one or more charged particle beams 9 on the sample 5 or on the layer of luminescent material 6 due to the scanning of the one or more charged particle beam spots by the scanning unit of the charged particle microscope. As schematically shown in FIG. 1, the objective lens 2 comprise an optical axis OA, wherein the objective lens actuator 3 is configured to move the objective lens 2 in a direction substantially perpendicular to the optical axis OA, in particular in a direction substantially parallel to the scanning direction of the one or more charged particle beams 9. The objective lens actuator 3 preferably comprises a voice coil.

Figure 2:
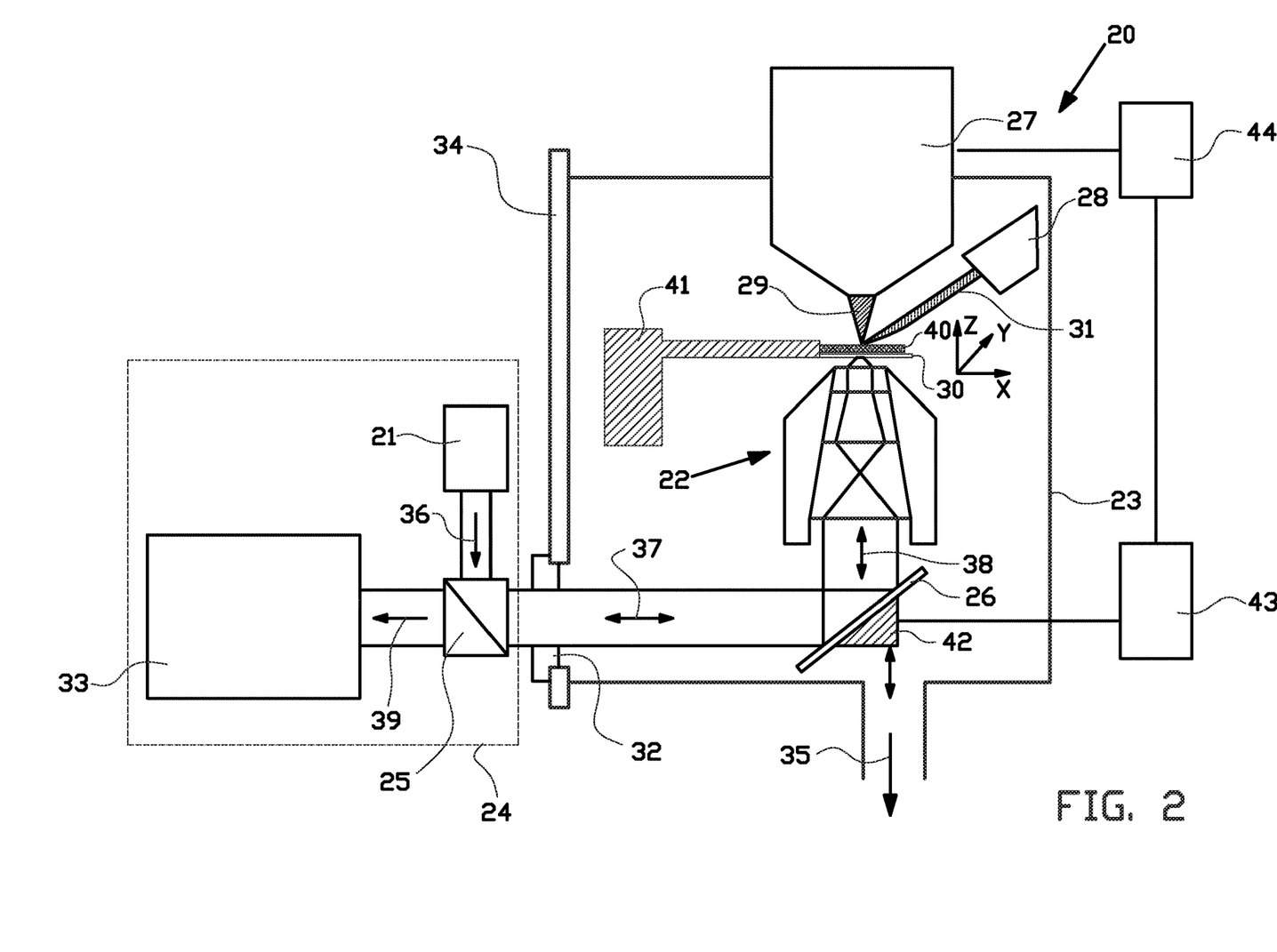
FIG. 2 schematically shows a second exemplary embodiment of an apparatus as typically improved by the present invention.

FIG. 2 schematically shows a second exemplary embodiment of an apparatus as typically improved by the present invention. The apparatus 20 of FIG. 2 comprises a Scanning Electron Microscope (SEM) 27 comprising a vacuum chamber 23 which is connected to a vacuum pump via a connector 35. Inside said vacuum chamber 23, a sample 40 is arranged, which sample 40 can be irradiated with one or more primary electron beams 29. The apparatus 20 comprises a detector 28 for detection of secondary charged particles 31 backscattered from the sample 40, or emitted from the sample 40 as a result of the one or more primary electron beams 29 impinging on the sample 40.

As schematically shown, the sample 40 is arranged on top of as sheet of scintillating material 30 which acts as a holder for holding the sample 40. The sheet of scintillator material 30, for example comprising a thin slab of Yttrium Aluminum Garnet (YAG, $Y_3AL_5O_{12}$).

The sample holder comprises a stage 41 which is configured for positioning and moving the sample 40 and the sheet of scintillating material 30. The sample holder comprises a stage for moving the sample 40 for providing six degrees of freedom in movement of the sample 40; thus providing translational movement along the X, Y and Z axis and rotational movement around the X, Y and Z axis. The sample holder is configured to position the sample 40 in between the SEM 27 and the sheet of the scintillator material 30.

Below the sheet of scintillator material 30 a microscope objective 22 is arranged inside the vacuum chamber 23, which is part of the optical assembly for detecting luminescent light from the scintillator material 30. In this particular example, the other major parts of the optical assembly are arranged outside the vacuum chamber 23 in an illumination and detection box 24.

The illumination and detection box 24 may comprise a light source 21, for example a LED of a Laser. The emitted light 36 from het light source 21 is directed out of the illumination and detection box 24 via a half transparent mirror or dichroic 25 and is directed into the vacuum chamber 23 via a window 32. This light 37, 38 is coupled into the microscope objective 22 via a mirror 26, for illuminating the sample 40. Although the illumination arrangement can be used for illuminating the sample with light and to study the sample under illumination by light, the illumination arrangement is not necessary to obtain an image using the transmitted electrons through the sample 40 which are converted into light by the sheet of scintillating material 30.

Light 37, 38 from the sample 40 and/or the sheet of scintillator material 30 is collected by the microscope objective 22 and is directed via the mirror 26 and the window 32 towards the illumination and detection box 24, and is imaged 39 onto a camera 33, for example a CCD detector.

As shown in FIG. 2, the light beams for illuminating and/or imaging the sample 40 enter into and passed from the vacuum chamber 23 via a window 32 which in this example is arranged in a door 34 of said vacuum chamber 23. The illumination and detection box 24 of the light optical microscope system is arranged outside vacuum chamber 23 and may be attached to the outside of the door 34. However, the illumination and detection part of the light optical assembly may as well be included fully inside, e.g. attached to a bottom part, of the vacuum chamber 23.

In this exemplary embodiment, it is advantageous to select a sheet of scintillator material 30 which is at least substantially transparent, preferably wherein the sheet of scintillator material is substantially transparent for light in a wavelength range in the visual spectrum. Accordingly, the sample 40 can be observed by means of the light optical microscope through the sheet of scintillator material 30.

As schematically indicated in FIG. 2, the mirror 26 is provided with an actuator 42 for moving the mirror 26 in a reciprocal linear movement in a direction towards and away from the microscope objective 22. Accordingly, the mirror 26 and the microscope objective 22 provides a shifting unit for shifting the optical beam path with respect to the camera 33. In addition, the inspection apparatus comprises a first control unit 44 for controlling the SEM and in particular the scanning unit inside the SEM, and a second control unit 43 for controlling the actuator 42 of the shifting unit. The first control unit 44 is configured for sending a scanning information signal to the second control unit 43, and the second control unit 43 is configured controlling the actuator based on the scanning information signal in order to synchronize the shifting of the optical beam path by the shifting unit with the scanning of the one or more electron beams by the SEM 27, in particular for at least partially compensating the movement of the one or more electron beams 29 on the sample 40 or on the layer of luminescent material 30 due to the scanning of the one or more electron beam spots by the scanning unit inside the SEM 27. Preferably said actuator 42 comprises a voice coil.

Figure 3:
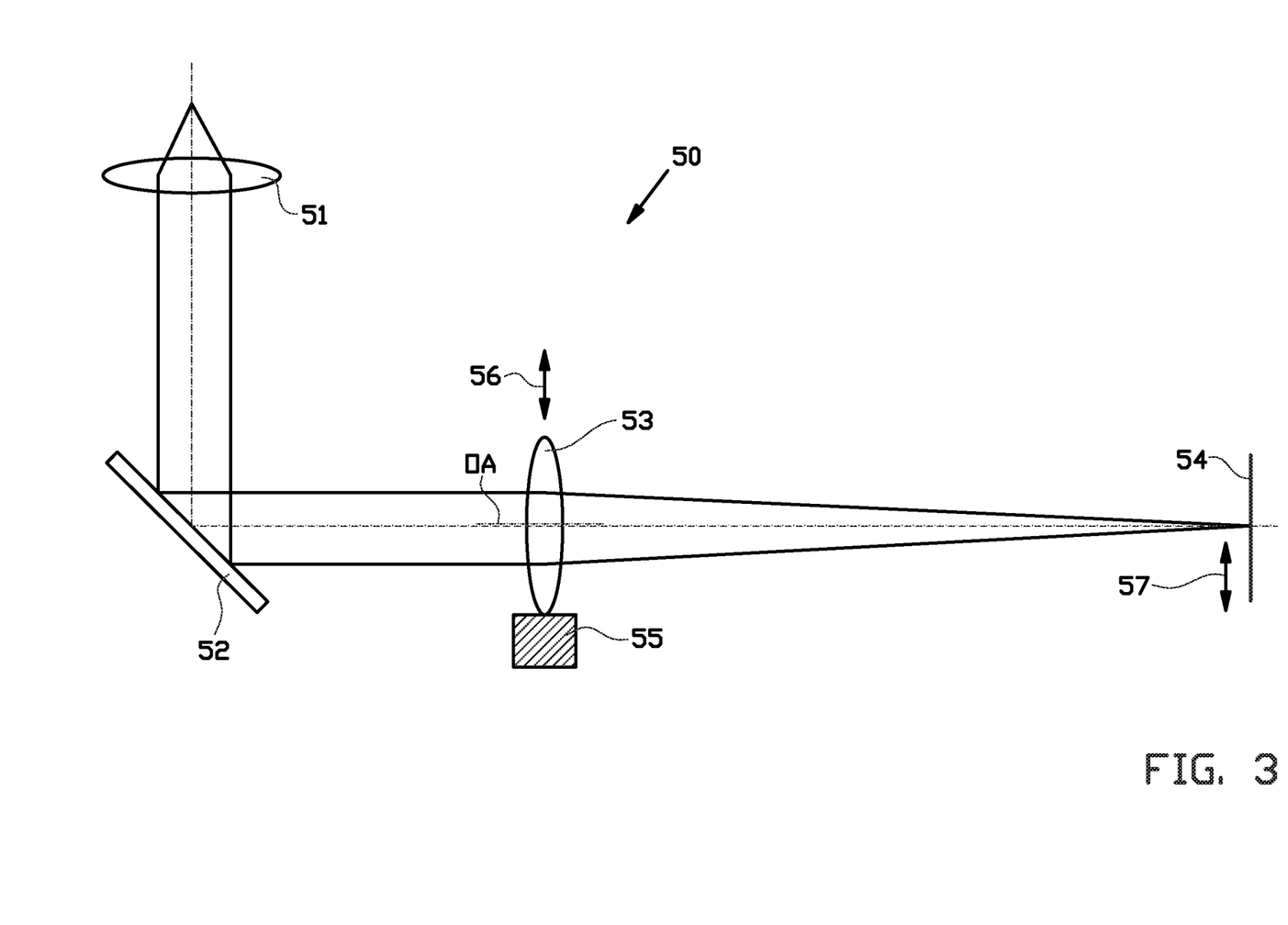
FIG. 3 schematically shows an example of a third embodiment of part of the optical assembly as improved by the present invention.

FIG. 3 schematically shows a third exemplary embodiment of an optical assembly 50 for use in the inspection apparatus as typically improved by the present invention. The optical assembly 50 comprises an objective lens 51, a folding mirror 52 and a projection lens 53 for projecting said at least part of said photons onto the photon detector 54. The projection lens 53 is connected to a projection lens actuator 55 for moving the projection lens 53 with respect to the photon detector 54. The projection lens 53 with the projection lens actuator 55 provides a shifting unit. The projection lens 53 comprise an optical axis OA and the projection lens actuator 55 is configured to move the projection lens 53 in a direction 56 substantially perpendicular to the optical axis OA of the projection lens 53. When the projection lens actuator 55 moves the projection lens 53 in the direction 56, the light projected by the projection lens 53 moves in the direction 57 over the detector 54. When applied in the inspection apparatus of the present invention, this movement is used to at least partially compensate the scanning movement of the one or more charged particle beams. Preferably the projection lens actuator 55 comprises a voice coil.

Figure 4:
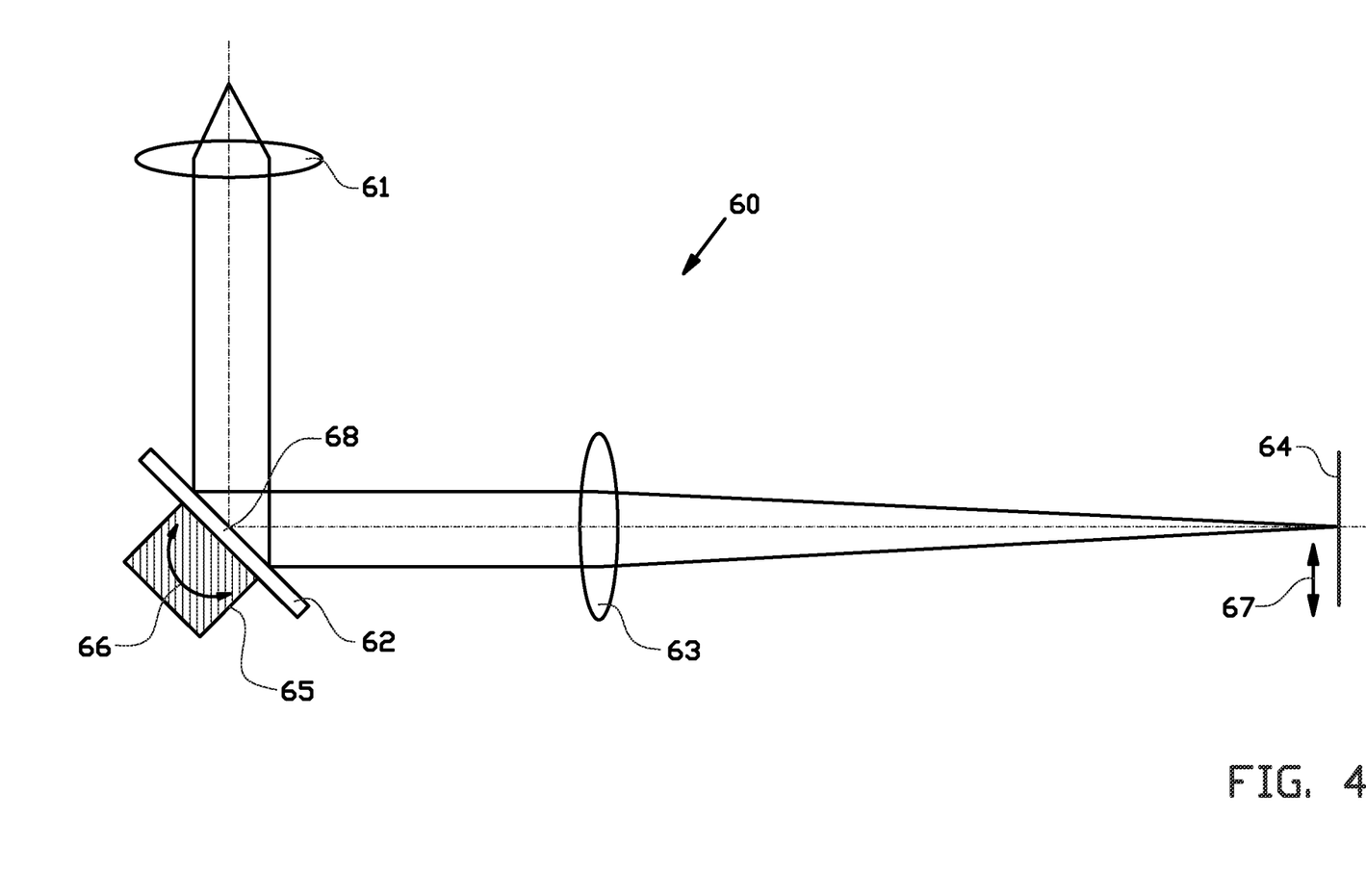
FIG. 4 schematically shows an example of a fourth embodiment of part of the optical assembly as improved by the present invention.

FIG. 4 schematically shows a fourth exemplary embodiment of an optical assembly 60 for use in the inspection apparatus as typically improved by the present invention. The optical assembly 60 comprises an objective lens 61, a folding mirror 62 and a projection lens 63 for projecting said at least part of said photons onto the photon detector 64. The mirror 62 is configured for reflecting the optical beam path at a deflection angle between 0 and 180 degrees, in this example at a deflection angle of substantially 90 degrees. The mirror 62 is connected to a mirror actuator 65 for tilting the mirror 62 with respect to the photon detector 64. The mirror 62 with the mirror actuator 65 provides a shifting unit. The mirror actuator 65 is configured for tilting the mirror 62 around a rotation axis 68, wherein the rotation axis 68 is arranged substantially perpendicular to the plane of the drawing. When the mirror actuator 65 moves the mirror 62 in the direction 66, the light projected onto the detector moves in the direction 67 over the detector 64. When applied in the inspection apparatus of the present invention, this movement is used to at least partially compensate the scanning movement of the one or more charged particle beams. Preferably the mirror actuator 65 comprises a galvanometer or a piezo-motor.

Figure 5:
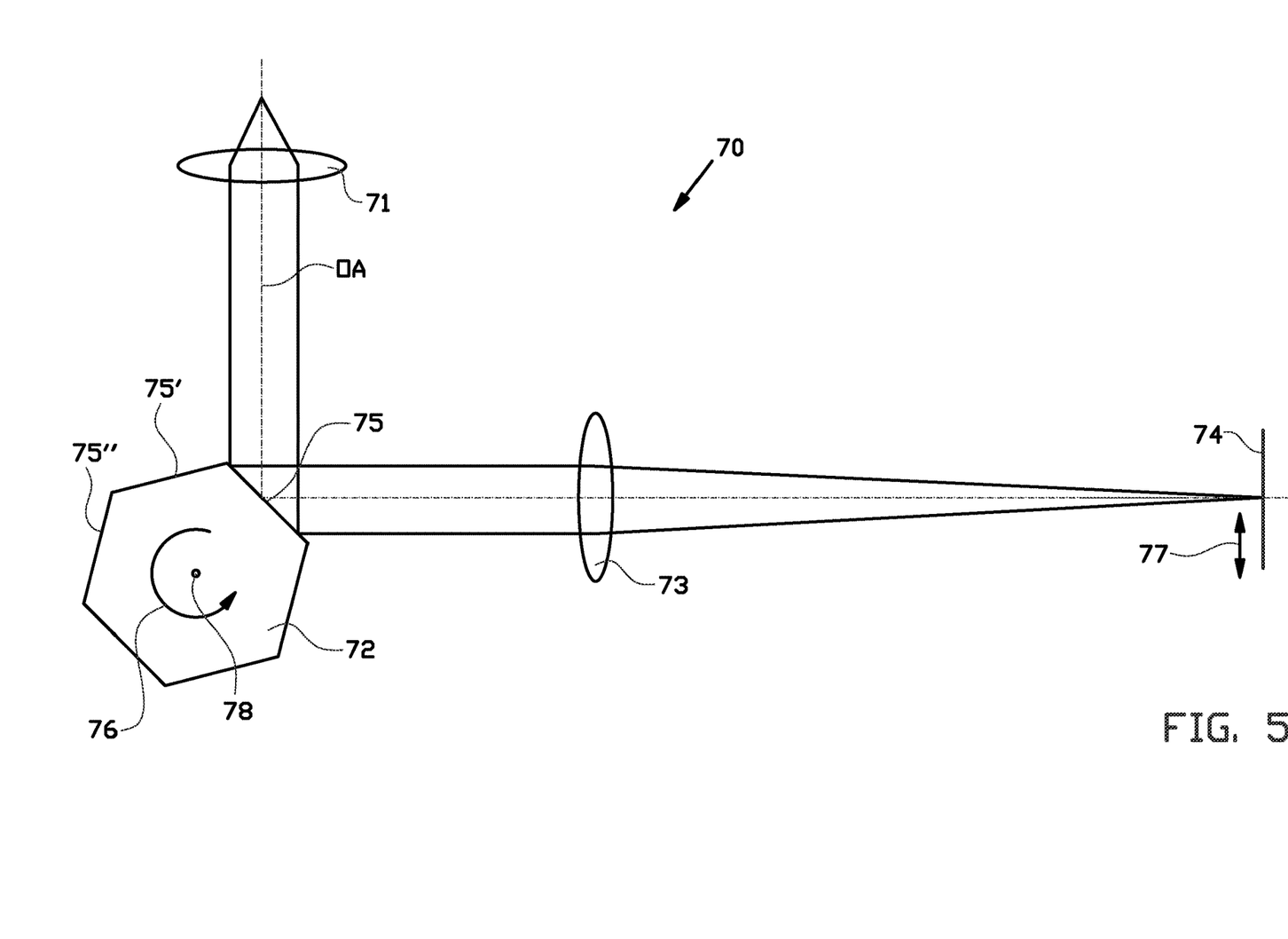
FIG. 5 schematically shows an example of a fifth embodiment of part of the optical assembly as improved by the present invention.

FIG. 5 schematically shows a fifth exemplary embodiment of an optical assembly 70 for use in the inspection apparatus as typically improved by the present invention. The optical assembly 70 comprises an objective lens 71, a polygon mirror 72, and a projection lens 73 for projecting said at least part of said photons onto the photon detector 74. The polygon mirror 72 is configured for reflecting the optical beam path at a deflection angle toward the detector 74. The polygon mirror 72 is connected to a rotation actuator (not shown) for rotating the polygon mirror 72 around a rotation axis 78, wherein the rotation axis 78 is arranged substantially perpendicular to the plane of the drawing. The outward facing facets 75, 75', 75" . . . of the polygon mirror each comprises a mirror surface for reflecting the light coming from the objective lens 71. When the rotation actuator rotates the polygon mirror 72, the facets 75, 75', 75" . . . are arranged successively in the light beam and successively reflect the light from the objective lens 71 towards the detector 74. The polygon mirror 72 with the rotation actuator provides a shifting unit. Due to the rotation, the angle of the reflecting mirror facet 75 with respect to the optical axis OA is constantly changed. When the rotation actuator rotates the polygon mirror 72 in the direction 76, the light projected onto the detector moves in the direction 77 over the detector 74. When applied in the inspection apparatus of the present invention, this movement is used to at least partially compensate the scanning movement of the one or more charged particle beams.

Figure 6A:
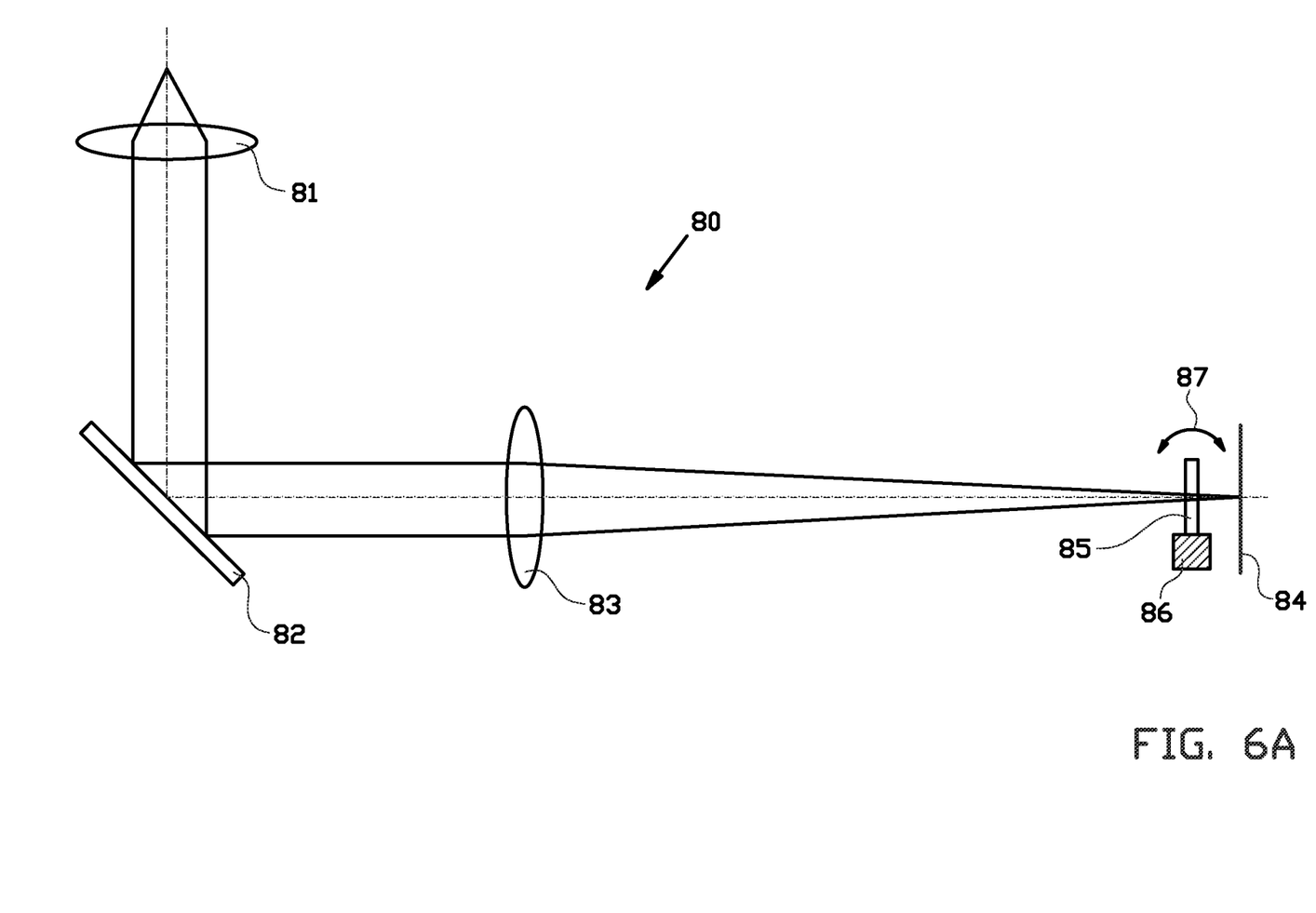
FIGS. 6A and 6B schematically show an example of a sixth embodiment of part of the optical assembly as improved by the present invention.
Figure 6B:
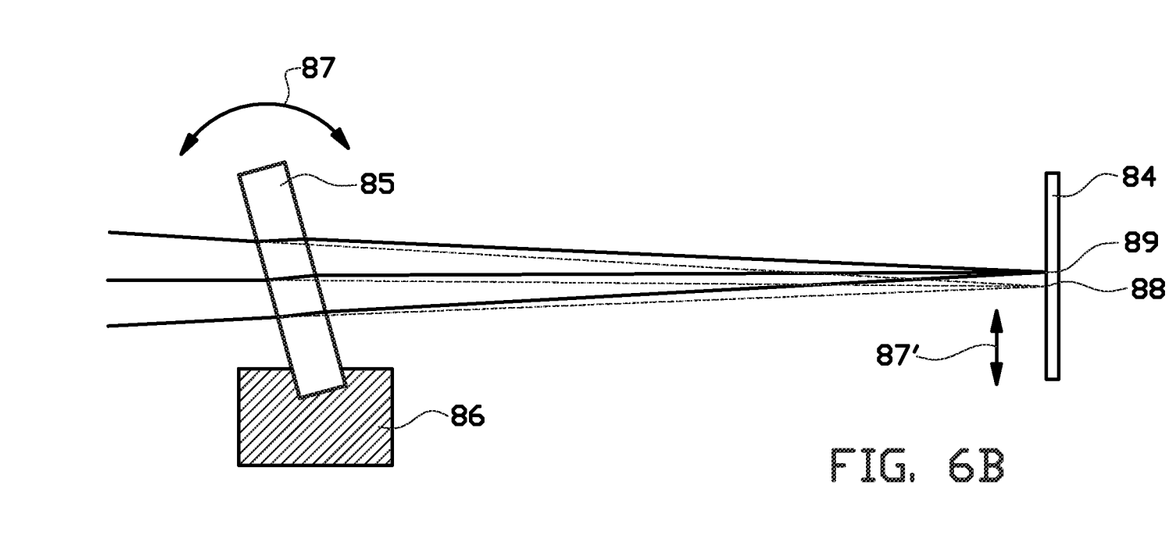

FIG. 6A schematically shows a sixth exemplary embodiment of an optical assembly 80 for use in the inspection apparatus as typically improved by the present invention. The optical assembly 80 comprises an objective lens 81, a folding mirror 82, and a projection lens 83 for projecting said at least part of said photons onto the photon detector 84. The optical assembly 80 further comprises an optical window 85 arranged in the optical beam path between the sample holder and the photon detector 84. In this particular example, the optical window 85 is arranged between the projection lens 83 and the detector 84. The optical assembly further comprises a tilting actuator 86 which is configured for tilting the optical window 85 in a tilting direction 87 as schematically indicated in FIG. 6A and FIG. 6B. The optical window 85 with the tilting actuator 86 provides a shifting unit. When the optical window 85 is arranged in a tilted position as shown in FIG. 6B, the optical beam path between the optical window 85 and the detector 84 is shifted in a direction 87' in the plane of the drawing. In the specific position shown in FIG. 6B, the focus point of the light is shifted from a first position 88 when the optical window is not tilted, to a second position 89 when the optical window is tilted as shown. When applied in the inspection apparatus of the present invention, this movement is used to at least partially compensate the scanning movement of the one or more charged particle beams.

Figure 7:
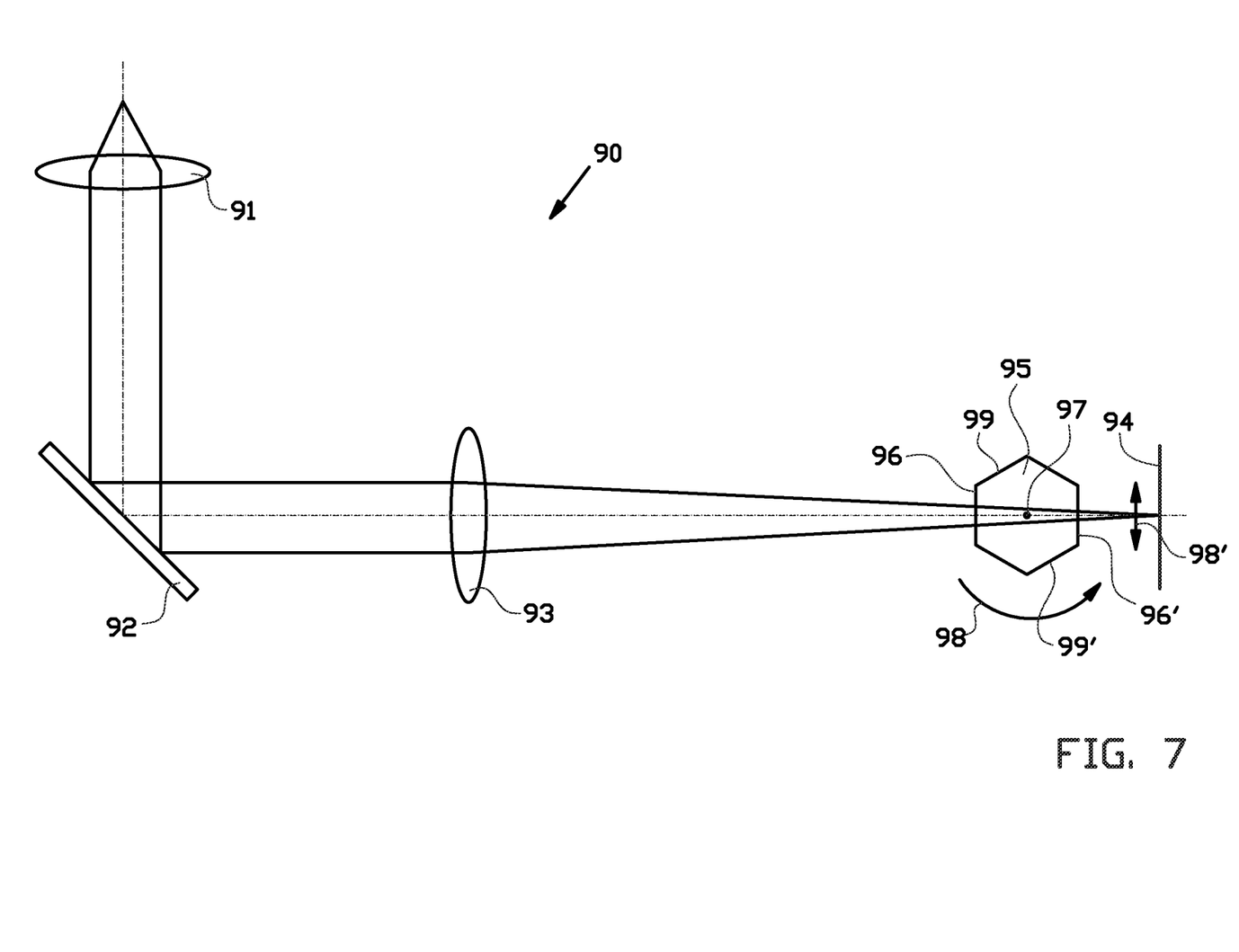
FIG. 7 schematically shows an example of a seventh embodiment of part of the optical assembly as improved by the present invention.

FIG. 7 schematically shows a seventh exemplary embodiment of an optical assembly 90 for use in the inspection apparatus as typically improved by the present invention. The optical assembly 90 comprises an objective lens 91, a folding mirror 92, and a projection lens 93 for projecting said at least part of said photons onto the photon detector 94. The optical assembly 90 further comprises an optical transparent polygon 95 arranged in the optical beam path towards the photon detector. In this example, the optical transparent polygon 95 is arranged between the projection lens 93 and the detector 94. The optical transparent polygon 95 is arranged so that the optical beam path traverses said optical transparent polygon 95 via two opposite side facets 96, 96'. The optical transparent polygon 95 preferably comprises an even number of side facets 96, 96', preferably 4, 6 or 8 side facets. The optical transparent polygon 95 is coupled to a rotation actuator (not shown) which is configured for rotating the optical transparent polygon 95 around a rotation axis 97. The optical transparent polygon 95 and the rotation actuator provides a shifting unit. When the optical transparent polygon 95 is rotated in a direction 98, the two opposite side facets 96, 96' move into a tilted position, in the same way as the optical window shown in FIG. 6B. Accordingly, the optical beam path between the optical transparent polygon 95 and the detector 94 is shifted in a direction 98' in the plane of the drawing. When the rotation continues, the two opposite side facets 96, 96' are tilted further and further, and the optical beam path is shifted further and further, until the next adjacent opposite side facets 99, 99' are arranged in the optical beam path and the shifting of the optical beam path starts a-new. When applied in the inspection apparatus of the present invention, this movement is used to at least partially compensate the scanning movement of the one or more charged particle beams.

It is noted that in the above exemplary embodiments the described movements of the shifting unit are a translation or rotation in the plane of the drawing. However, the movements of the various examples of the shifting unit may also be a translation or rotation in an other direction, in particular in a direction perpendicular to the plane of the drawing for compensating a scanning direction of the one or more charged particle beams in the direction perpendicular to the plane of the drawing.

In addition, when the scanning deflector is arranged for moving the one or more charged particle beam in more than one direction, in particularly in two orthogonal directions, the inspection apparatus may comprise a first and a second shifting unit. The second shifting unit is preferably configured for shifting the one or more light spots and/or the photon detector with respect to each other in a shifting direction substantially perpendicular to the shifting direction of the first shifting unit. Each of the above described embodiments may be used for one, or for both of the first and second shifting units.

In summary, the invention relates to an apparatus for inspecting a sample. The apparatus comprises:
a sample holder for holding the sample,
a charged particle column for generating and focusing one or more charged particle beams at one or more charged particle beam spots onto the sample,
a scanning deflector for moving said charged particle beam spot(s) over the sample, a photon detector configured for detecting photons created when said one or more charged particle beams impinge on the sample or when said one or more charged particle beams impinge onto a layer of luminescent material after transmission through the sample, an optical assembly for projecting or imaging at least part of said photons from said charged particle beam spot(s) along an optical beam path onto said photon detector, and a shifting unit for shifting the optical beam path with respect to the photon detector or vice versa.

In a particular embodiment, a transmission detector for a multi-beam SEM wherein an array of electron beams hit a luminescent plate after traversing through a thin sample, is provided. A light microscope images the bottom of the luminescent plate onto a light detector. In addition, a unit is arranged in the light path between the luminescent plate and the light detector, which unit can independently move the light spots on the light detector. Without this unit the light emitting spots generated in the luminescent plate move when the electron beams are scanned over the sample. Thus the light spots imaged on the light detector also move over the surface of the light detector. It is however preferred to keep the signal from particular electron beam substantially on the same spot on the light detector. Accordingly, the unit arranged in the light path can compensate the movement of the light emitting spots on the luminescent plate so that the light spots on the light detector do not move. In addition, the detector of the present invention also allows to move the array of electron beams over a larger distance, which allows to record several (for instance 3×3) scan field before moving the sample stage. This saves the overhead time related to the stage settling.

It is to be understood that the above description is included to illustrate the operation of the preferred embodiments and is not meant to limit the scope of the invention. From the above discussion, many variations will be apparent to one skilled in the art that would yet be encompassed by the scope of the present invention.

The invention claimed is:

1. An apparatus for inspecting a sample, wherein the apparatus comprises:
   a sample holder for holding the sample,
   a charged particle column for generating and directing one or more primary charged particle beams towards the sample holder,
   wherein said charged particle column is configured for focusing said one or more primary charged particle beams at one or more charged particle beam spots onto the sample,
   a scanning unit for scanning the one or more primary charged particle beams over the sample in a scanning direction,
   a photon detector for detecting photons created by said one or more focused primary charged particle beams when said one or more primary charged particle beams impinge on the sample or when said one or more primary charged particle beams impinge onto a layer of luminescent material after transmission of said one or more primary charged particle beams through the sample,
   an optical assembly for projecting or imaging at least part of said photons from said one or more charged particle beam spots along an optical beam path onto one or more light spots on said photon detector, wherein the optical assembly comprises a mirror or a polygon mirror arranged in the optical beam path between the sample holder and the photon detector, wherein the mirror or the polygon mirror is configured for reflecting the optical beam path at a deflection angle between 0 and 180 degrees, and
   a shifting unit for shifting the one or more light spots and/or the photon detector with respect to each other, wherein the shifting unit comprises a mirror actuator which is configured for adjusting a tilting angle of the mirror or a rotating actuator which is configured for rotating the polygon mirror, wherein said shifting unit is configured for at least partially compensating a movement of the one or more primary charged particle beams on the sample or on the layer of luminescent material due to the scanning of the one or more charged particle beam spots by the scanning unit.

2. The apparatus according to claim 1, wherein the optical assembly comprises an objective lens for collecting at least part of said photons from said one or more charged particle beam spots,
   wherein the shifting unit comprises an objective lens actuator for moving the objective lens with respect to the sample holder, and
   wherein the objective lens actuator is configured to move the objective lens in a direction substantially parallel to the scanning direction of the primary charged particle beams.

3. The apparatus according to claim 2, wherein the objective lens comprises an optical axis, wherein the objective lens actuator is configured to move the objective lens in a direction substantially perpendicular to the optical axis of the objective lens.

4. The apparatus according to claim 1, wherein the optical assembly comprises a projection lens for projecting said at least part of said photons onto the photon detector,
   wherein the shifting unit comprises a projection lens actuator for moving the projection lens with respect to the photon detector.

5. The apparatus according to claim 4, wherein the projection lens comprises an optical axis, wherein the projection lens actuator is configured to move the projection lens in a direction substantially perpendicular to the optical axis of the projection lens.

6. The apparatus according to claim 1,
   wherein the optical assembly comprises a mirror arranged in the optical beam path between the sample holder and the photon detector,
   wherein the mirror actuator is configured for tilting the mirror around a rotation axis,
   wherein the rotation axis is arranged substantially perpendicular to the scanning direction of the primary charged particle beams.

7. The apparatus according to claim 1,
   wherein the optical assembly comprises a polygon mirror arranged in the optical beam path between the sample holder and the photon detector,
   wherein the polygon mirror is configured for rotating the mirror around a rotation axis,
   wherein the rotation axis is arranged substantially perpendicular to the scanning direction of the primary charged particle beams.

8. The apparatus according to claim 1, wherein the optical assembly comprises an optical window arranged in the optical beam path between the sample holder and the photon detector,
   wherein the optical window is arranged so that the optical beam path traverses said optical window, wherein the shifting unit comprises a tilting actuator which is configured for tilting the optical window.

9. The apparatus according to claim 8, wherein the tilting actuator is configured for tilting the optical window around a rotation axis,
wherein the rotation axis is arranged substantially perpendicular to the scanning direction of the primary charged particle beams.

10. The apparatus according to claim 1, wherein the optical assembly comprises an optical transparent polygon arranged in the optical beam path between the sample holder and the photon detector,
wherein the optical transparent polygon is arranged so that the optical beam path traverses said optical transparent polygon,
wherein the shifting unit comprises a rotating actuator which is configured for rotating the optical transparent polygon.

11. The apparatus according to claim 10, wherein the rotating actuator is configured for rotating the optical transparent polygon around a rotation axis,
wherein the rotation axis is arranged substantially perpendicular to the scanning direction of the primary charged particle beams.

12. The apparatus according to claim 1, wherein the apparatus further comprises a first control unit for controlling the scanning unit, and a second control unit for controlling the shifting unit,
wherein the first control unit is configured for sending a scanning information signal to the second control unit, and
wherein the second control unit is configured controlling the shifting unit based on the scanning information signal.

13. The apparatus according to claim 1, wherein the shifting unit is a first shifting unit,
wherein the apparatus further comprises a second shifting unit,
wherein the second shifting unit is configured for shifting the one or more light spots and/or the photon detector with respect to each other in a shifting direction substantially perpendicular to the shifting direction of the first shifting unit.

14. A method for inspecting a sample, wherein the method comprises the steps of:
arranging the sample in a sample holder,
generating and directing one or more primary charged particle beams towards the sample using a charged particle column,
wherein said charged particle column focuses said one or more primary charged particle beams at one or more charged particle beam spots onto the sample,
wherein photons are created by said one or more focused primary charged particle beams when said one or more primary charged particle beams impinge on the sample or when said one or more primary charged particle beams impinge onto a layer of luminescent material after transmission of said one or more primary charged particle beams through the sample,
projecting or imaging at least part of said photons from said one or more charged particle beam spots along an optical beam path onto one or more light spots on a photon detector using an optical assembly, wherein the optical assembly comprises a mirror or a polygon mirror arranged in the optical beam path between the sample holder and the photon detector, wherein the mirror or the polygon mirror is configured for reflecting the optical beam path at a deflection angle between 0 and 180 degrees,
detecting photons using the photon detector, and
scanning the one or more primary charged particle beams over the sample in a scanning direction using a scanning unit, and shifting the one or more light spots and/or the photon detector with respect to each other using a shifting unit, wherein the shifting unit comprises a mirror actuator which is configured for adjusting a tilting angle of the mirror or a rotating actuator which is configured for rotating the polygon mirror,
wherein said shifting unit at least partially compensates a movement of the one or more primary charged particle beams on the sample or on the layer of luminescent material due to the scanning of the one or more primary charged particle beams by the scanning unit and compensates the movement of the one or more primary charged particle beams so that the one or more light spots substantially remain at the same position on the photon detector during the scanning of the one or more primary charged particle beams by the scanning unit.

15. The method according to claim 14, wherein the one or more primary charged particle beams are scanned over a first substantially rectangular area on the sample, subsequently the one or more primary charged particle beams and the sample are moved with respect to each other over a distance substantially equal to the width of the substantially rectangular area, and then the one or more primary charged particle beams are scanned over a second substantially rectangular area on the sample.

16. A computer-readable medium having computer-executable instructions adapted to cause an apparatus for inspecting a sample to perform the method according to claim 14.

17. The method according to claim 14, wherein the method comprises providing an apparatus for inspecting a sample, wherein the apparatus comprises:
a sample holder for holding the sample,
a charged particle column for generating and directing one or more primary charged particle beams towards the sample holder,
wherein said charged particle column is configured for focusing said one or more primary charged particle beams at one or more charged particle beam spots onto the sample,
a scanning unit for scanning the one or more primary charged particle beams over the sample in a scanning direction,
a photon detector for detecting photons created by said one or more focused primary charged particle beams when said one or more primary charged particle beams impinge on the sample or when said one or more primary charged particle beams impinge onto a layer of luminescent material after transmission of said one or more primary charged particle beams through the sample,
an optical assembly for projecting or imaging at least part of said photons from said one or more charged particle beam spots along an optical beam path onto one or more light spots on said photon detector, and
a shifting unit for shifting the one or more light spots and/or the photon detector with respect to each other, wherein said shifting unit is configured for at least partially compensating a movement of the one or more primary charged particle beams on the sample or on the layer of luminescent material due to the scanning of the one or more charged particle beam spots by the scanning unit.

\* \* \* \* \*